United States Patent [19]

Gier

[11] 4,231,838
[45] Nov. 4, 1980

[54] METHOD FOR FLUX GROWTH OF KTiOPO₄ AND ITS ANALOGUES

[75] Inventor: Thurman E. Gier, Chadds Ford, Pa.

[73] Assignee: E. I. Du Pont de Nemours and Company, Wilmington, Del.

[21] Appl. No.: 898,444

[22] Filed: Apr. 20, 1978

[51] Int. Cl.² .................... B01J 17/04; B01J 17/20
[52] U.S. Cl. ............................... 156/600; 156/607; 156/DIG. 75; 156/DIG. 105
[58] Field of Search ............... 156/603, 600, 607, 619, 156/624, DIG. 75, DIG. 105; 106/42; 332/7.51

[56] References Cited

U.S. PATENT DOCUMENTS 3,949,323   4/1976   Bierlein et al. ..................... 332/7.51

OTHER PUBLICATIONS

Masse et al., Bull. Soc. Mineral, Crystallogr. 94, 437-439 (1971).
Tordjman et al., Zeit. fur Krist., 139, 103-115, (1974).
Gmelin Handbuch, vol. 41 Ti, 43, 8th Ed., (1951).
Ouvard, Comptes Rendu., 111, 177-179, 1890.
Zumsted et al., J. App. Physics, 47, 4980-4985, (11-1976).

*Primary Examiner*—Bradley R. Gams

[57] ABSTRACT

A process for the manufacture of single crystals of $MTiOXO_4$, wherein M is K, Rb or Tl and X is P or As, of optical quality and of sufficient size for use in nonlinear optical devices. In the process, starting ingredients chosen to be within the region of the ternary phase diagram in which the desired crystal $MTiOXO_4$ product is the only stable solid phase, are heated to produce $MTiOXO_4$ and then controllably cooled to crystallize the desired product. In a preferred method the ingredients are placed in a temperature gradient in which the hot zone ranges from about 800°–1000° C. and the cold zone about 10°–135° C. cooler, maintaining the temperature gradient for about 3 days to about 3 weeks, cooling, and recovering $MTiOXO_4$ crystals.

9 Claims, 7 Drawing Figures

METHOD FOR FLUX GROWTH OF KTiOPO4 AND ITS ANALOGUES

DESCRIPTION

1. Technical Field

This invention relates to a process for producing large, optically useful single crystals of $KTiOPO_4$ and its analogues.

2. Background Art

The use of single crystals of $MTiOXO_4$, wherein M is at least one of K, Rb, or Tl and X is at least one of P or As, in nonlinear optical devices is disclosed in U.S. Pat. No. 3,949,323. For most optical applications, optical-quality crystals with dimensions of the order of one millimeter or more are needed. The reference patent discloses preparation of such crystals by hydrothermal methods.

R. Masse and J. C. Grenier, Bull, Soc. Mineral Crystallogr. 94, 437–439 (1971) have reported on the preparation of powders of $KTiOPO_4$ (and the analogues $RbTiOPO_4$ and $TlTiOPO_4$) by heating $KPO_3$ and $TiO_2$ at temperatures between 900° C. and 1200° C. and then cooling at a rate of about 80° C. per hour. Excess $KPO_3$ was removed by washing with water. The ratio of $KPO_3/TiO_2$ was varied over the range from 4 to 1.0 of two phases, $KTiOPO_4$ and $KTi_2(PO_4)_3$, were always found in the product.

Crystal structure determination of $KTiOPO_4$ crystal prepared by the flux method of Masse et al. above is disclosed by I. Tordjman et al., Zeit. fur Krist. 139, 103–115 (1974).

The Gmelin Handbuch, Vol. 41 Ti, 8th edition (1951), reports that L. Ouvard (Comptes rendus 111, 117–179 (1890)) formed $KTiO(PO_4)$ by melting hydrated $TiO_2$ with $K_4P_2O_7$ and $K_3PO_4$.

DESCRIPTION OF THE INVENTION

Figure 1:
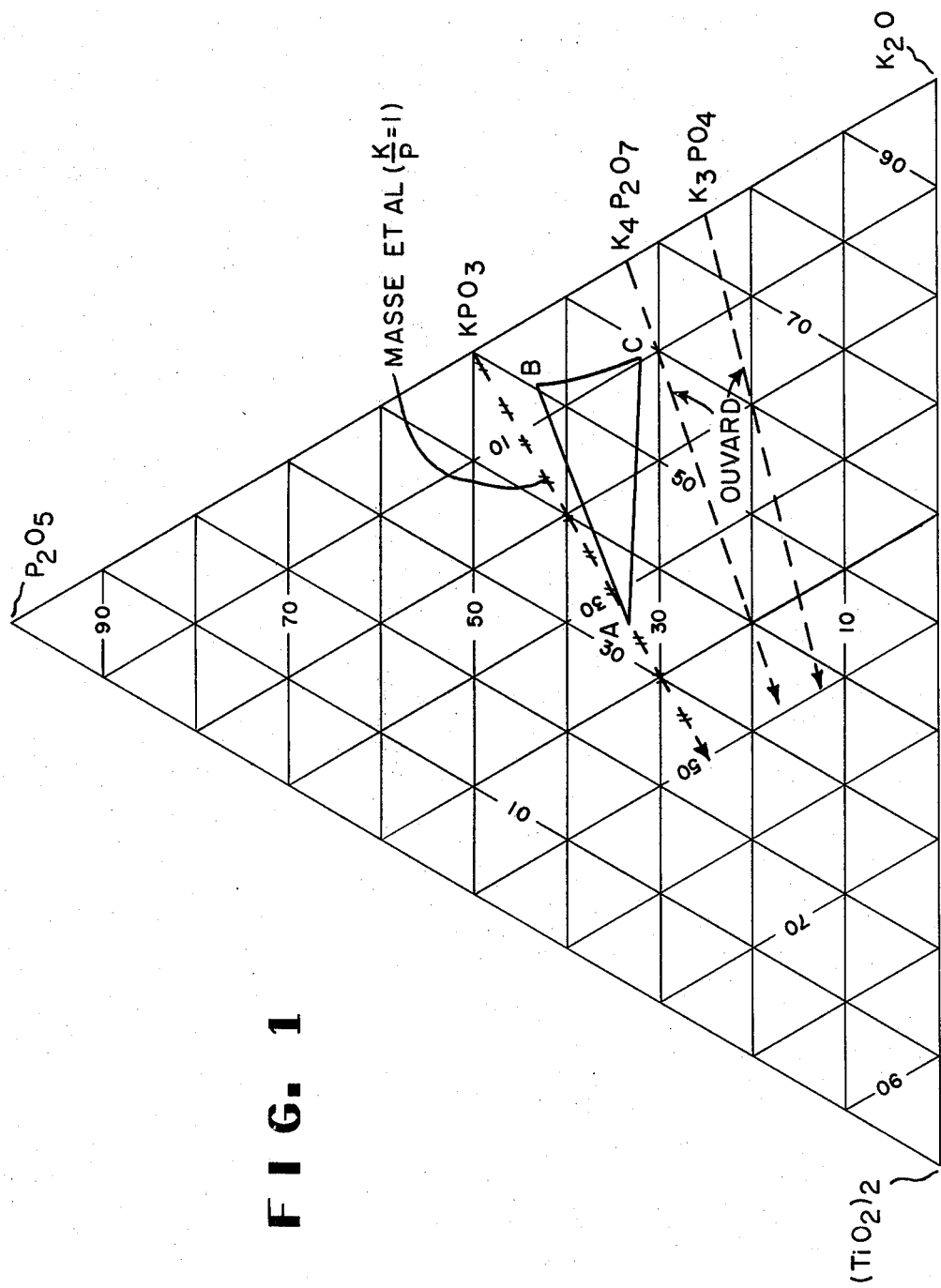
FIGS. 1–7 show respectively the regions of the ternary phase diagrams of $K_2O/P_2O_5/(TiO_2)_2$, $Rb_2O/P_2O_5/(TiO_2)_2$, $Tl_2O/P_2O_5/(TiO_2)_2$, $K_2O/As_2O_5/(TiO_2)_2$, $Rb_2O/As_2O_5/(TiO_2)_2$, $Tl_2O/As_2O_5/(TiO_2)_2$, and $RbKO/P_2O_5/(TiO_2)_2$ within which the Pna2$_1$-type $MTiOXO_4$ composition of this invention is the only solid phase in equilibrium with the flux.

The invention is a method for producing a single crystal of $MTiOXO_4$, of optical quality and of sufficient size for use in nonlinear optical devices, where M is at least one of K, Rb or Tl and X is at least one of P or As, by heating starting materials comprising $MTiOXO_4$ or its precursors with a flux $M/X/O$ or its precursors, wherein the ratio of the starting materials or their precursors lies within the region of the ternary phase diagram $M_2O/X_2O_5/(TiO_2)_2$ where the product $MTiOXO_4$ is the only stable solid phase in equilibrium with the flux when molten, which comprises a process selected from the group consisting of (A(1) heating the starting materials, in proportions that there is also an excess of solid $MTiOXO_4$ relative to the $M/X/O$ flux at the highest temperature reached, in a temperature gradient with the hot zone at a temperature range of about 800° C. to about 1000° C. and the cold zone at a temperature range which is about 10° C. to about 135° C. cooler than the hot zone, to produce a melt, (2) maintaining the temperature gradient for about 3 days to about 3 weeks to allow crystal growth, and
(3) cooling and recovering a single crystal of $MTiOXO_4$; and B(1) uniformly heating the starting materials, in proportions that there is also an excess of $M/X/O$ flux relative to $MTiOXO_4$ at the highest temperature reached, to a temperature range of about 700° C. to about 1100° C. until a clear solution is obtained,
(2) slowly cooling at a rate no greater than 5° C. per hour to cause crystallization of $MTiOXO_4$ and recovering same.

In the preferred gradient heating process A, the proportion of the starting materials is such that there is always an excess of solid $MTiOXO_4$ present in the hot zone, i.e. the ratio of $MTiOXO_4$ to flux is greater than the saturation value. Typically this ratio ranges from about 0.25 to 20 or more, depending upon the temperature of the hot zone.

In the uniform heating process B the reverse is true, i.e. at the highest temperature reached the ratio of $MTiOXO_4$ to flux is less than the saturation value. Generally this ratio ranges from about 0.25 to 10, depending upon the highest temperature reached and the composition of the mixture at which complete solution occurs. In this process the cooling is conducted at a rate no greater than 5° C. per hour until the materials solidify, generally at about 600°–800° C., and then quenching to room temperature and recovering crystals of $MTiOXO_4$.

The $M/X/O$ flux comprises the oxides $M_2O$ and $X_2O_5$ or precursors such as carbonates or nitrates of M or ammonium salts of X which give rise to the oxides during the heating process. The flux can be made from mixtures of $MH_2XO_4$ and $M_2XHO_4$ and use of selected quantities allows adjustment of the M/X ratio so that the starting quantities of the ingredients fall within the proper region of the ternary phase diagram. Other materials which can be used as part of the flux include $MHCO_3$, $M_2CO_3$, $MNO_3$, $NH_4H_2XO_4$, $(NH_4)_2HXO_4$ and the like.

$TiO_2$ can also be used as the starting material and in this case $MTiOXO_4$ is formed during the course of the heating. When operating in this way, the amounts of M and X present must be large enough not only to combine with the $TiO_2$ to form $MTiOXO_4$, but also to provide the $M/X/O$ flux.

The invention is carried out by placing the ingredients in a container made of platinum or another noble metal which is stable at the temperatures used and then subjecting the container and its contents to heating.

In the temperature gradient process A, greater control of the crystal growth is obtained by inserting into the cold zone region a suitably held small crystal of $MTiOXO_4$ upon which crystal growth occurs. This is preferable to allowing spontaneous nucleation to occur at the container wall.

With the Tl compositions above about 800° C. and the K compositions above about 1050° C., portions of the flux are somewhat volatile; this can be controlled by growing the crystals in a closed container.

Growth of large, optically useful crystals of $MTiOXO_4$, wherein M is at least one of K, Rb, or Tl and X is at least one of P or As, from molten non-aqueous fluxes provides advantages over the hydrothermal process used previously. The invention is a more economical, low pressure process requiring less sophisticated equipment and resulting in larger production rates. It is necessary to start out with a ratio of ingredients that fall within the region of the ternary phase diagram $M_2O/X_2O_5/(TiO_2)_2$ in which the desired product $MTiOXO_4$ is the only stable solid phase and is in equilibrium with the molten flux. The general procedure used to find this region of the phase diagram was to prepare various stoichiometries in the $M_2O/X_2O_5/(TiO_2)_2$ ternary. This was accomplished by preparing mixtures of various combinations of $TiO_2$, $MH_2XO_3$, $M_2CO_3$, $X_2O_5$, $MHCO_3$, and/or $NH_4H_2XO_4$ which were equivalent to particular composition on the ternary phase diagram. These mixtures were held at 800° C. for at least 12 hours to insure equilibration and then air quenched. The water soluble flux was removed by washing the resultant material with hot water. X-ray powder patterns were then used to determine the solid phase or phases which had been in equilibrium with the flux at 800° C. The region of the phase diagram which corresponds to only the one phase, $MTiOXO_4$, in equilibrium with the flux at 800° C. is thus indentified. At temperatures other than 800° C., some variation in this stability region is expected; however, these variations will be primarily in the respective solubilities and the region found at 800° C. serves as a guide for the ratio of ingredients to be used at somewhat higher or lower temperatures.

FIG. 1 shows the $K_2O/P_2O_5/(TiO_2)_2$ ternary phase diagram at 800° C. When the ratio of the starting materials falls within the triangular region ABC, $KTiOPO_4$ is the only solid phase in equilibrium with the flux. The mol fractions of each phase at points A, B, and C are:

|   | $K_2O$ | $P_2O_5$ | $(TiO_2)_2$ |
|---|---|---|---|
| A | .333 | .333 | .333 |
| B | .50 | .43 | .07 |
| C | .585 | .32 | .095 |

The line BC represents the solubility of $KTiOPO_4$ in the flux. This line is sensitive to changes in temperature. As the temperature is increased, line BC will move toward the center of the phase diagram, i.e. toward the $KTiOPO_4$ composition which is represented by point A. At 1150° C. $KTiOPO_4$ itself melts and the triangular single phase region ABC does not exist.

Also shown in FIG. 1 are the regions explored by Masse et al. and Ouvard discussed above who used $TiO_2$ with various amounts of $KPO_3$ and $K_4P_2O_7$ and $K_3PO_4$ respectively. $KTiOPO_4$ is only one of the solid phases present in these compositions.

Figure 2:
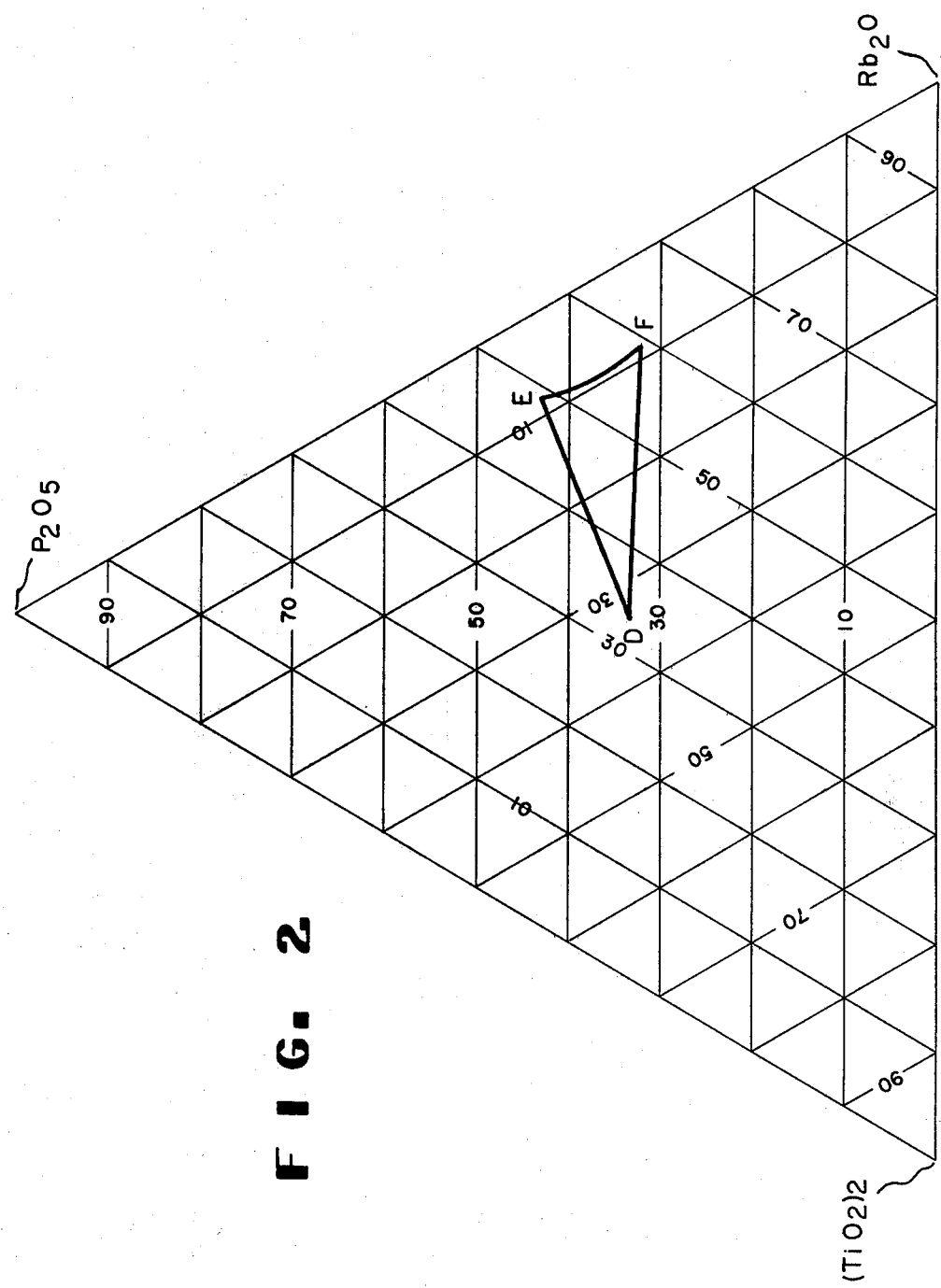

FIG. 2 shows the $Rb_2O/P_2O_5/(TiO_2)_2$ ternary phase diagram at 800° C. Within the triangular region DEF, $RbTiOPO_4$ is the only solid phase in equilibrium with the flux and is represented by point D. The corresponding mol fractions at each point are:

|   | $Rb_2O$ | $P_2O_5$ | $(TiO_2)_2$ |
|---|---|---|---|
| D | .333 | .333 | .333 |
| E | .490 | .430 | .080 |
| F | .595 | .320 | .085 |

Figure 3:
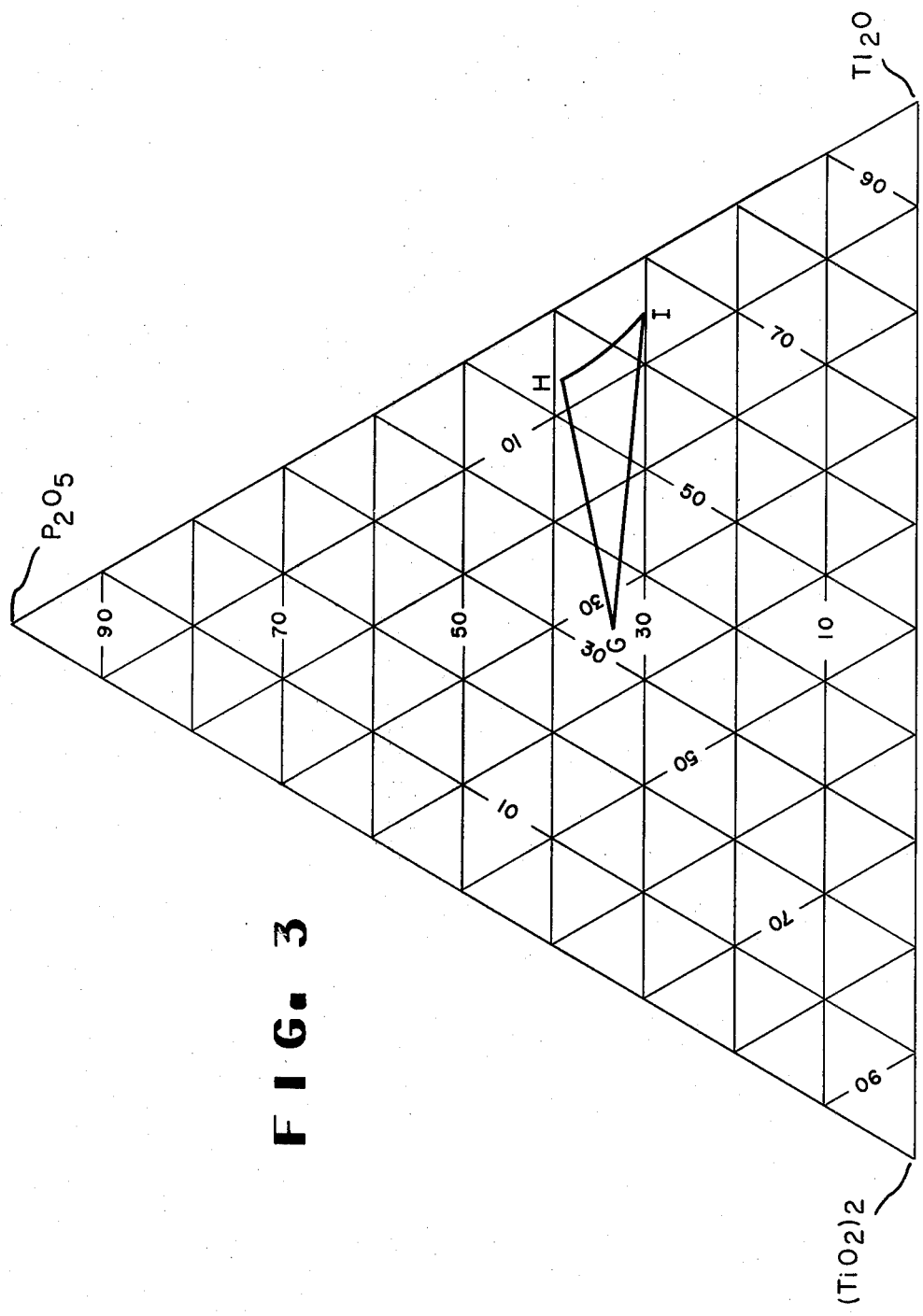

FIG. 3 shows the $Tl_2O/P_2O_5/(TiO_2)_2$ ternary phase diagram at 800° C. Within the triangular region GHI, $TlTiOPO_4$ is the only solid phase in equilibrium with the flux and is represented by point G. The mol fractions at each point are:

|   | $Tl_2O$ | $P_2O_5$ | $(TiO_2)_2$ |
|---|---|---|---|
| G | .333 | .333 | .333 |
| H | .540 | .390 | .070 |
| I | .650 | .300 | .050 |

Figure 4:
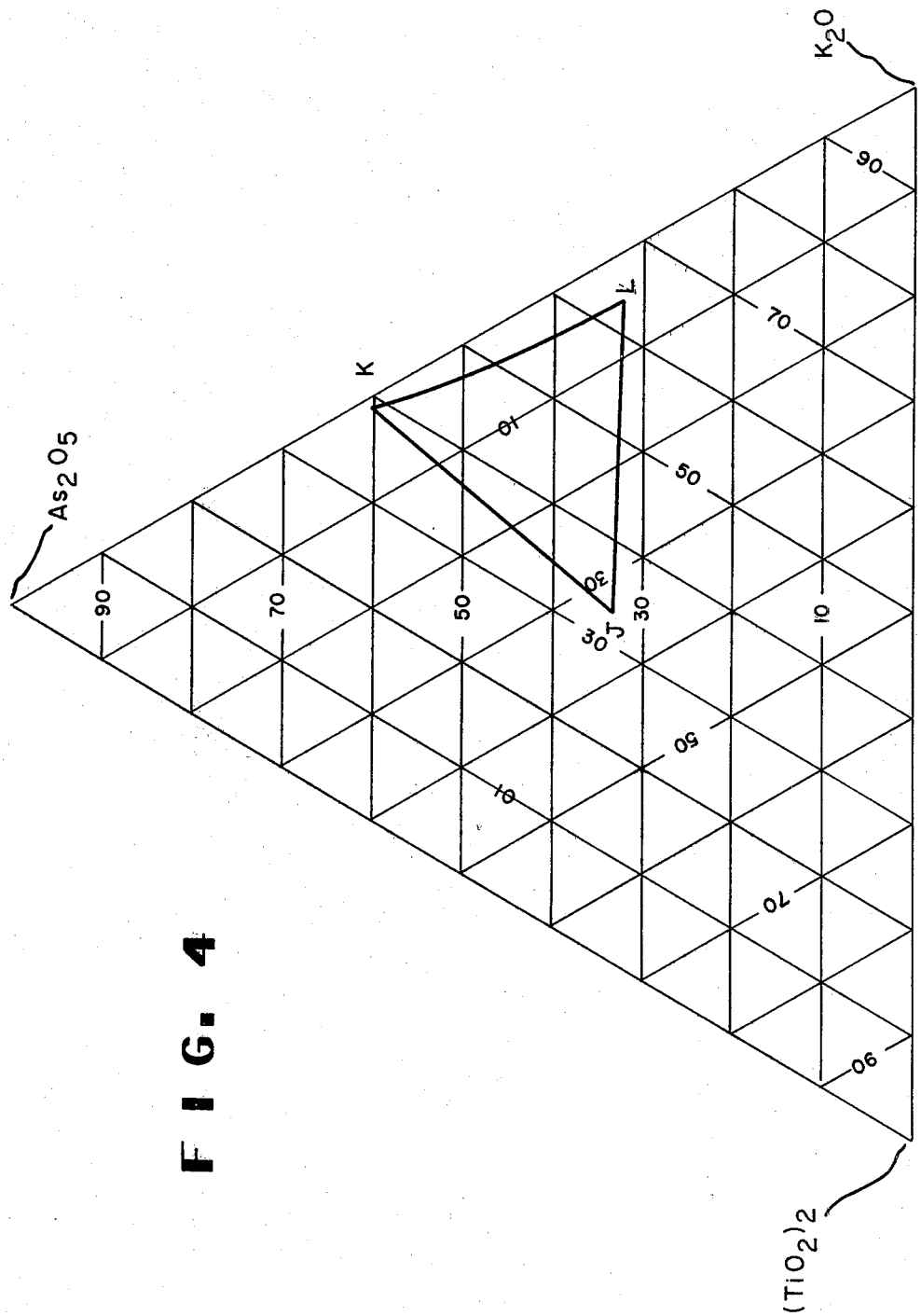

FIG. 4 shows the $K_2O/As_2O_5/(TiO_2)_2$ ternary phase diagram. In the area enclosed by the triangular region JKL, $KTiOAsO_4$ is the only solid phase in equilibrium with the flux, and is represented by point J. The mol fractions at each point are:

|   | $K_2O$ | $As_2O_5$ | $(TiO_2)_2$ |
|---|---|---|---|
| J | .333 | .333 | .333 |
| K | .390 | .600 | .01 |
| L | .635 | .320 | .045 |

Figure 5:
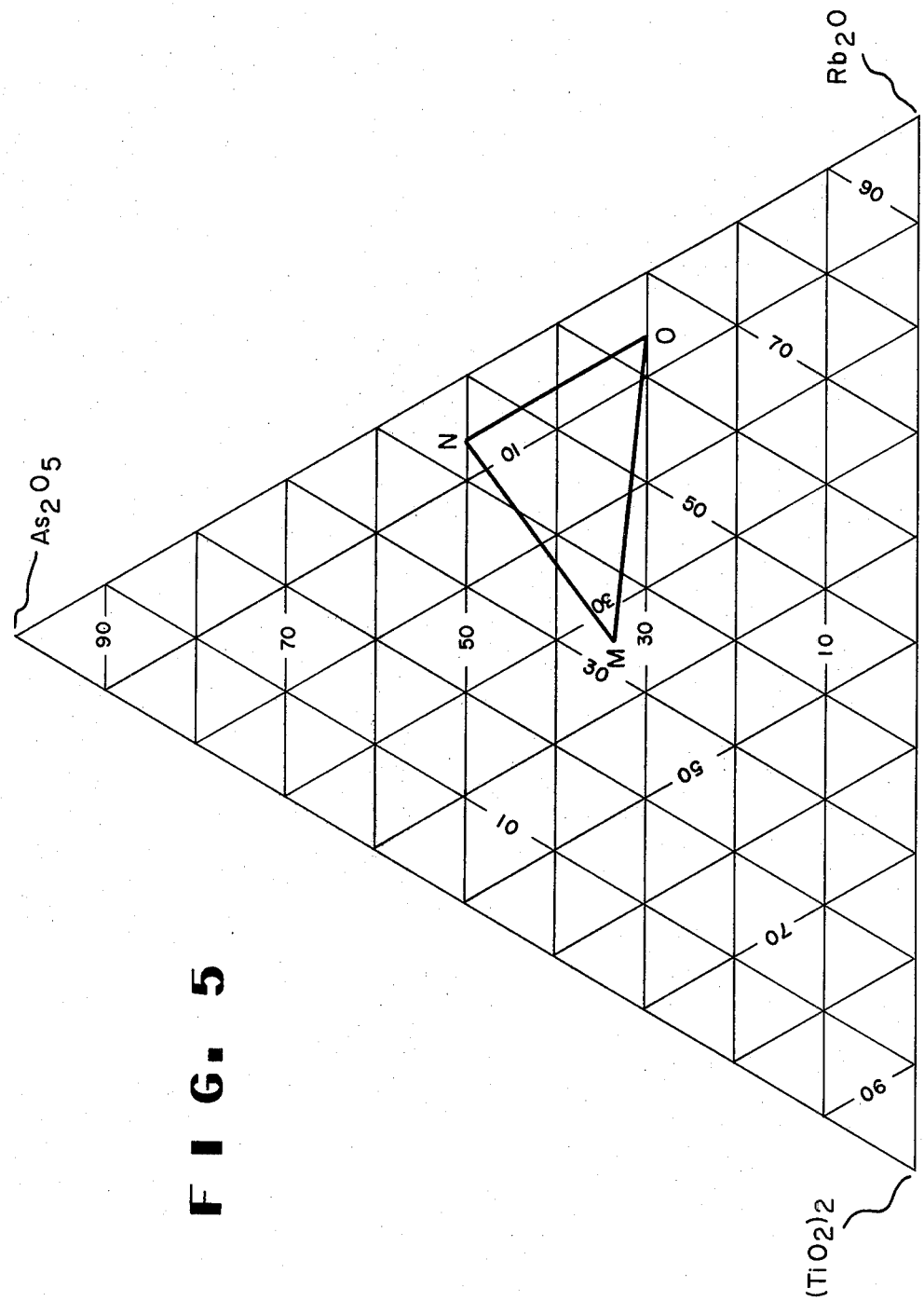

FIG. 5 shows the $Rb_2O/As_2O_5/(TiO_2)_2$ ternary phase diagram. In the triangular region MNO, $RbTiOAsO_4$ is the only solid phase in equilibrium with the flux and is represented by point M. The mol fractions at each point are:

|   | $Rb_2O$ | $As_2O_5$ | $(TiO_2)_2$ |
|---|---|---|---|
| M | .333 | .333 | .333 |
| N | .44 | .50 | .06 |
| O | .64 | .30 | .06 |

Figure 6:
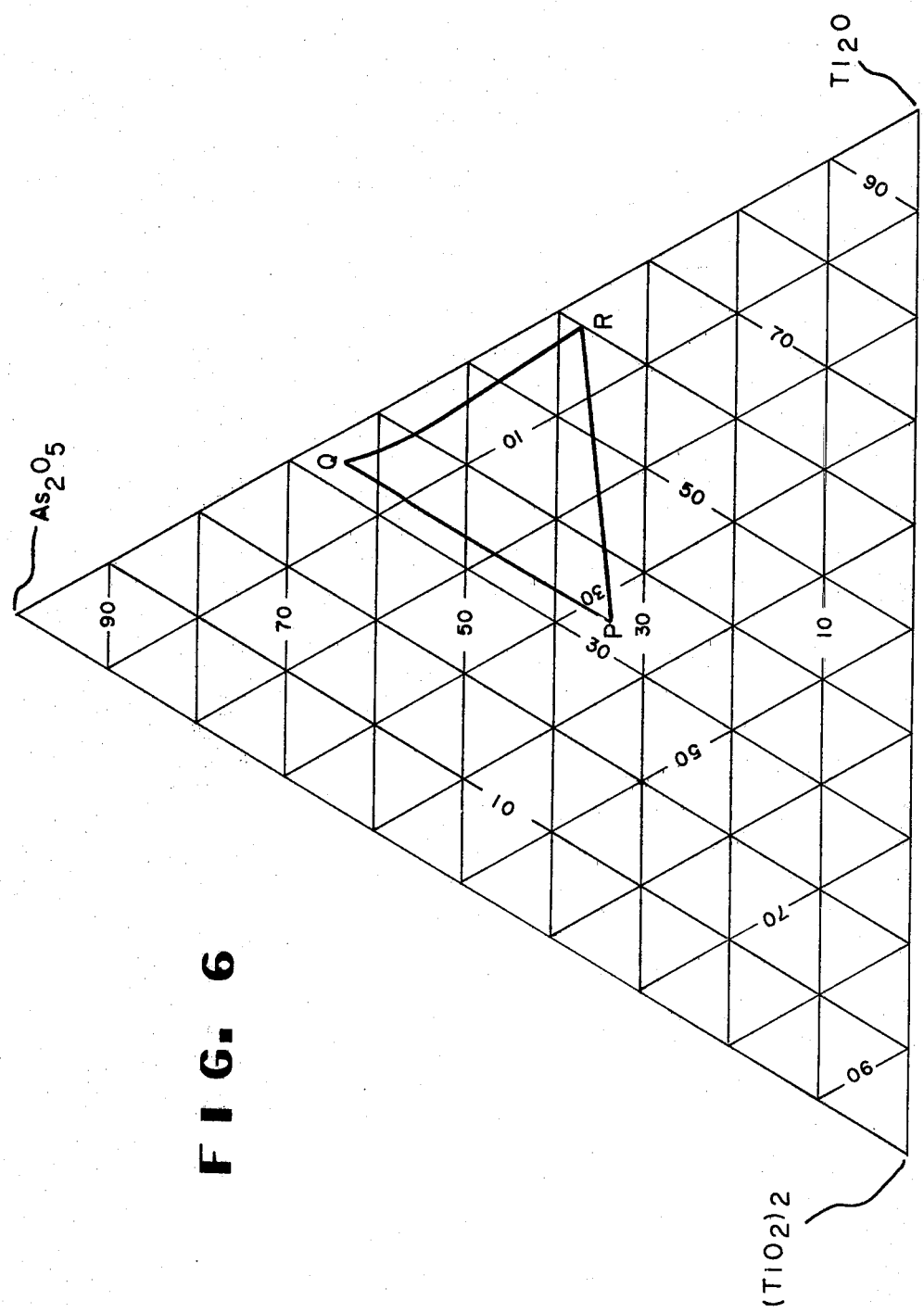

FIG. 6 shows the $Tl_2O/As_2O_5/(TiO_2)_2$ ternary phase diagram. Inside the triangular region PQR, $TlTiOAsO_4$ is the only solid phase in equilibrium with the flux and is represented by point P. The mol fractions at each point are:

|   | $Tl_2O$ | $As_2O_5$ | $(TiO_2)_2$ |
|---|---|---|---|
| P | .333 | .333 | .333 |
| Q | .330 | .640 | .030 |
| R | .600 | .375 | .025 |

Figure 7:
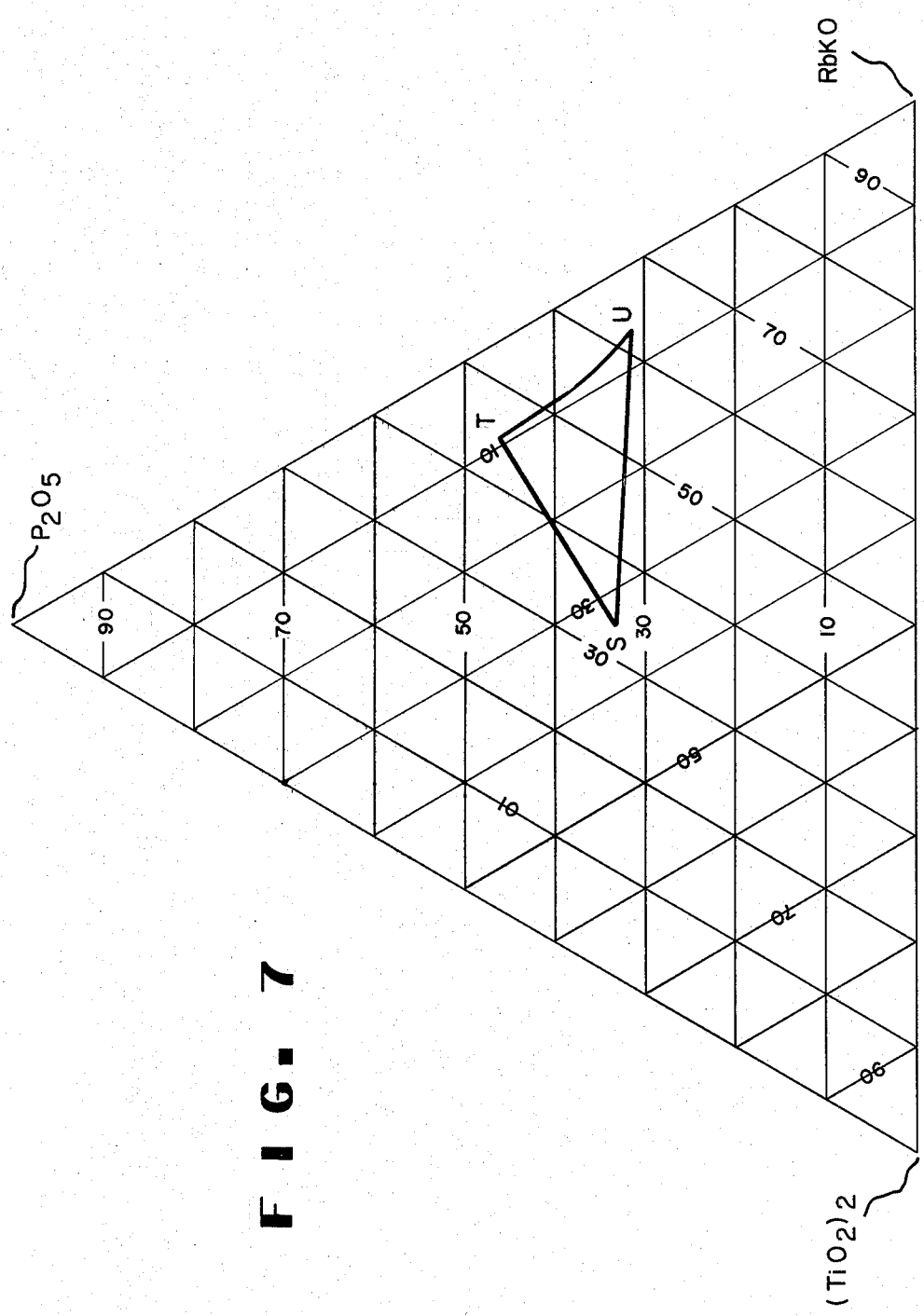

FIG. 7 shows the $RbKO/P_2O_5/(TiO_2)_2$ ternary phase diagram. In the triangular region STU, (K, Rb)$TiOPO_4$ with the $Pna2_1$ structure is the only solid phase in equilibrium with the flux and is represented by point S. The mol fractions at each point are:

|   | RbKO | $P_2O_5$ | $(TiO_2)_2$ |
|---|---|---|---|
| S | .333 | .333 | .333 |
| T | .445 | .460 | .095 |
| U | .625 | .315 | .060 |

BEST MODE

The preferred method for making single crystals comprises mixing a combination of starting ingredients corresponding to a composition within the appropriate region of the phase diagram (e.g., for $KTiOPO_4$, in the region ABC of FIG. 1), placing these ingredients into a platinum container, establishing a temperature gradient in the container which may be either vertical or horizontal with the hot zone at temperatures of about 800° C. to about 1000° C. and with the cold zone about 10° to about 135° C. cooler. This temperature gradient is maintained for about 3 days to about 3 weeks followed by cooling of the container and removing the contents, washing the material at the cold zone region in hot water to dissolve away the flux, and recovering crystals of MTiOXO$_4$. It is sometimes advantageous to use acidified hot water to facilitate the dissolving of the flux.

For many optical applications superior crystal properties will result when M and X are each comprised of only one of the stated elements. However, crystals which have mixtures of elements for M and/or X can also be grown by this process.

The following examples are intended to illustrate the process of this invention but not to limit the scope of the invention.

EXAMPLE 1

A mixture of 10 g of powdered KTiOPO$_4$ and 10 g of K$_6$P$_4$O$_{13}$ flux, in which the K/P ratio is 1.5, prepared by heating together equimolar quantities of KH$_2$PO$_4$ and K$_2$HPO$_4$, was sealed into a ½" (1.27 cm) diam×7" (17.78 cm) long vertical platinum tube under vacuum. The tube was heated to 1050° C., held 60 hours to homogenize the fluid system, and then cooled at a rate of 5° C./hr to 600° C. Following an air-quench the platinum tube was stripped from the solidified rod. Hot water acidified with H$_3$PO$_4$ was used to dissolve away the flux. Crystals of KTiOPO$_4$ having dimensions up to 3×2×2 mm were recovered.

EXAMPLE 2

A mixture of 2.40 g of powdered TiO$_2$, 9.84 g of KH$_2$PO$_4$ and 3.55 of K$_2$HPO$_4$ were thoroughly mixed and prefused to drive off H$_2$O and form KTiOPO$_4$. This mixture is equivalent to a mixture of 5.94 g of KTiOPO$_4$ and 8.20 g of flux in which the ratio K/P is 1.325. The product was added to a 25 cc platinum crucible, heated for about 15 hrs at 900°–1000° C., then heated at 1100° C. for two hrs to further homogenize the solution, transferred to a second furnace and slow cooled from 950° C. to 685° C. at a rate of 2° C./hr. The crucible was then air quenched. The contents of the crucible were removed and hot water was used to dissolve the flux. Recovered were 3.65 g of clear KTiOPO$_4$ crystals having dimensions up to 3×2×2 mm.

EXAMPLE 3

A mixture of 1.60 g of TiO$_2$, 22.84 g of KH$_2$AsO$_4$ and 3.0 g of KHCO$_3$ was placed in a 25 ml platinum crucible and heated to 1050° C. for about 15 hrs to give a clear solution. This mixture is equivalent to 4.84 g of KTiOAsO$_4$ in 17.64 g of flux (K/As=1.3). The temperature was lowered and the melt cooled from 960° C. to 756° C. at a rate of 5° C./hr. The crucible was then fast cooled to 575° C., air quenched, and the contents removed. The flux was dissolved in hot water and 2.85 g of faint yellow crystals of KTiOAsO$_4$ measuring up to 3×2×2 mm in size were recovered.

EXAMPLE 4

A mixture of 6.48 g of TiO$_2$, 37.0 g of KH$_2$PO$_4$, and 33.25 g of K$_2$HPO$_4$ was placed in a 6" long, 40 cc volume platinum container. This mixture is equivalent to a mixture of 16.0 g of KTiOPO$_4$ in 54 g of flux (K/P=1.5). After heating to 1000° C. and cooling, a glass was present in the container. For this mixture the saturation temperature is about 600°–650° C. Then 10.8 g of KTiOPO$_4$ crystals were placed on top of the glass material in the designated hot zone end. The total charge was equivalent to 0.5 g of KTiOPO$_4$ per g of flux. The container was heated to 800° C. to melt the flux and a temperature gradient of 880° C.–747° C. was then established. After 6¾ days, the container was furnace cooled to room temperature and the contents washed with hot water to dissolve the flux. 2.22 g of untransported KTiOPO$_4$ were recovered from the hot zone end and 7.19 g of KTiOPO$_4$ crystals of optical quality and up to 5×4×4 mm in size were recovered from the cold zone end.

EXAMPLE 5

A platinum crucible 1½ in. (3.8 cm) in diameter and about 5 in. (7.7 cm) long was placed in a vertical furnace and arranged so that a temperature gradient could be established between the upper and lower ends of the crucible. The crucible was charged with a 416 gm mixture of KH$_2$PO$_4$ and K$_2$HPO$_4$ flux having a K/P ratio of 1.5 and 248 gm of KTiOPO$_4$, i.e. 0.80 gm KTiOPO$_4$ per gm flux. The saturation temperature for such a mixture is 930° C. At temperatures below 930° C., there is excess KTiOPO$_4$ present. A seed crystal of KTiOPO$_4$ was suspended above the melt and the top of the crucible was maintained at a temperature of 912° C. and the bottom at 925° C. for about 15 hours. The seed was then lowered into the upper (cooler) part of the melt and kept there for about 147 hours while the top of the crucible was maintained at 906°–909° C. and the bottom at 922°–924° C. The seed was then slowly pulled through the melt, i.e. raised, at a rate of about 0.4 mm per day. Pulling continued for 5 days during which time the bottom of the crucible was maintained at 924°–925° C. and the top at 908°–910° C. At the end of the 5th day of pulling, the seed was completely removed from the melt and the furnace allowed to cool for about 20 hours before removing the seed from the furnace. A cluster of large flat crystals of KTiOPO$_4$ had grown on the seed. Flux was then washed out of the cluster of crystals using an ultrasonic water bath. The total weight of the cluster was 9.8 gm. The largest of the optically clear crystals had dimensions of approximately 15 mm×8 mm×2 mm.

Crystals of RbTiOPO$_4$, TlTiOPO$_4$, TlTiOAsO$_4$, RbTiOAsO$_4$ and (K,Rb)TiOPO$_4$ can be made by using the appropriate ratio of starting ingredients so as to be within the desired triangular regions shown in FIGS. 2, 3, 5, 6 and 7, respectively, and using the preparative methods of Examples 1 or 5.

From the foregoing examples, it can be seen that industrially useful, high quality, large crystals are best prepared by the method of Example 5.

Industrial Applicability

The process of this invention is useful industrially for the preparation of single crystals of MTiOXO$_4$ of optical quality and of sufficient size for use, inter alia, as the nonlinear crystal element in nonlinear optical devices such as parametric amplifiers, oscillators and second harmonic generators.

I claim:

1. In an improved process for producing a single crystal of MTiOXO$_4$ by combining and heating starting materials comprising MTiOXO$_4$ and a nonaqueous flux M/X/O, or their precursors, where M is selected from the group consisting of K, Rb and Tl and X is selected from the group consisting of P and As, said process being carried out either by (a) heating the combined starting materials, in such amounts that the ratio of MTiOXO$_4$ to flux at the highest heating temperature is greater than the saturation value, in a temperature gradient wherein the hot zone is within the range about 800° C. to about 1000° C. and the cold zone is within the range about 10° C. to about 135° C. cooler than the hot zone so as to produce a nonaqueous melt; maintaining the temperature gradient for about 3 days to about 3 weeks to allow crystal growth; and cooling and recovering crystalline MTiOXO$_4$, or (b) uniformly heating the combined starting materials, in such amounts that the ratio of MTiOXO$_4$ to flux at the highest heating temperature is less than the saturation value, to a temperature within the range about 700° C. to about 1100° C. until a clear nonaqueous solution is produced; slowly cooling the solution at a rate no greater than 5° C. per hour to effect crystallization of MTiOXO$_4$; and recovering crystalline MTiOXO$_4$, the improvement characterized in that the composition of the combined starting materials is within the trigonal regions ABC, DEF, GHI, JKL, MNO, PQR or STU of FIGS. 1 to 7, respectively, wherein the Pna2$_1$-type MTiOXO$_4$ is the only stable solid phase in equilibrium with the molten flux.

2. The process of claim 1 wherein a seed crystal of MTiOXO$_4$ is at least partially immersed in the melt in the cold zone of the temperature gradient to control crystal growth.

3. The process of claim 1 for producing KTiOPO$_4$ wherein said starting ingredients are selected so as to fall within the area of the FIG. 1 ternary phase diagram K$_2$O/P$_2$O$_5$/(TiO$_2$)$_2$ bounded by the three points A, B and C defined by the mol fractions:

|   | K$_2$O | P$_2$O$_5$ | (TiO$_2$)$_2$ |
|---|---|---|---|
| A | .333 | .333 | .333 |
| B | .50 | .43 | .07 |
| C | .585 | .32 | .095 |

4. The process of claim 1 for producing RbTiOPO$_4$ wherein said starting ingredients are selected so as to fall within the area of the FIG. 2 ternary phase diagram Rb$_2$O/P$_2$O$_5$/(TiO$_2$)$_2$ bounded by the three points D, E and F defined by the mol fractions:

|   | Rb$_2$O | P$_2$O$_5$ | (TiO$_2$)$_2$ |
|---|---|---|---|
| D | .333 | .333 | .333 |
| E | .490 | .430 | .080 |
| F | .595 | .320 | .085 |

5. The process of claim 1 for producing TlTiOPO$_4$ wherein said starting ingredients are selected so as to fall within the area of the FIG. 3 ternary phase diagram Tl$_2$O/P$_2$O$_5$/(TiO$_2$)$_2$ bounded by the three points G, H and I defined by the mol fractions:

|   | Tl$_2$O | P$_2$O$_5$ | (TiO$_2$)$_2$ |
|---|---|---|---|
| G | .333 | .333 | .333 |
| H | .540 | .390 | .070 |
| I | .650 | .300 | .050 |

6. The process of claim 1 for producing KTiOAsO$_4$ wherein said starting ingredients are selected so as to fall within the area of the FIG. 4 ternary phase diagram K$_2$O/As$_2$O$_5$/(TiO$_2$)$_2$ bounded by the three points J, K and L defined by the mol fractions:

|   | K$_2$O | As$_2$O$_5$ | (TiO$_2$)$_2$ |
|---|---|---|---|
| J | .333 | .333 | .333 |
| K | .390 | .600 | .01 |
| L | .635 | .320 | .045 |

7. The process of claim 1 for producing RbTiOAsO$_4$ wherein said starting ingredients are selected so as to fall within the area of the FIG. 5 ternary phase diagram Rb$_2$O/As$_2$O$_5$/(TiO$_2$)$_2$ bounded by the three points M, N and O defined by the mol fractions

|   | Rb$_2$O | As$_2$O$_5$ | (TiO$_2$)$_2$ |
|---|---|---|---|
| M | .333 | .333 | .333 |
| N | .44 | .50 | .06 |
| O | .64 | .30 | .06 |

8. The process of claim 1 for producing TlTiOAsO$_4$ wherein said starting ingredients are selected so as to fall within the area of the FIG. 6 ternary phase diagram Tl$_2$O/As$_2$O$_5$/(TiO$_2$)$_2$ bounded by the three points P, Q and R defined by the mol fractions

|   | Tl$_2$O | As$_2$O$_5$ | (TiO$_2$)$_2$ |
|---|---|---|---|
| P | .333 | .333 | .333 |
| Q | .330 | .640 | .030 |
| R | .600 | .375 | .025 |

9. The process of claim 1 for producing (K, Rb)TiOPO$_4$ wherein said starting ingredients are selected so as to fall within the area of the FIG. 7 ternary phase diagram RbKO/P$_2$O$_5$/(TiO$_2$)$_2$ bounded by the three points S, T and U defined by the mol fractions

|   | RbKO | P$_2$O$_5$ | (TiO$_2$)$_2$ |
|---|---|---|---|
| S | .333 | .333 | .333 |
| T | .445 | .460 | .095 |
| U | .625 | .315 | .060 |

\* \* \* \* \*